United States Patent [19]

Alker

[11] 4,380,731
[45] Apr. 19, 1983

[54] SYSTEM FOR MONITORING THE OPERATION OF INDIVIDUAL CONNECTORS IN A MULTIPATH COUPLING NETWORK

[75] Inventor: Dietrich E. Alker, Eningen U.A., Fed. Rep. of Germany

[73] Assignee: Wandel U. Goltermann GmbH & Co., Reutlingen, Fed. Rep. of Germany

[21] Appl. No.: 127,311

[22] Filed: Mar. 5, 1980

[30] Foreign Application Priority Data

Mar. 9, 1979 [DE] Fed. Rep. of Germany ....... 2909268

[51] Int. Cl.³ ...................... G01R 31/02; G01R 15/12
[52] U.S. Cl. .................................. 324/51; 324/73 AT
[58] Field of Search ...................... 324/51, 66, 73 AT; 371/2 S

[56] References Cited

U.S. PATENT DOCUMENTS 3,600,673  8/1971  Kokhe ................................... 324/66
4,015,200  3/1977  Strandh .................................. 324/51

Primary Examiner—Gerard R. Strecker
Assistant Examiner—Walter E. Snow
Attorney, Agent, or Firm—Karl F. Ross

[57] ABSTRACT

A plurality of first stations are linked with respective connectors which can be selectively activated to establish a signal path between any one of these stations and a second station via an intervening coupling network. Each connector includes at least one series switch between a pair of shunt switches, the former being closed while the latter are open in the activated state thereof. Selection is carried out with the aid of a control unit which, upon a switchover from one first station to another, sends a test signal through the hitherto active connector with successive reversals of its shunt and series switches and with measurement of the resulting impedances of that connector to determine its decoupling effect before activating the newly selected connector.

7 Claims, 3 Drawing Figures

SYSTEM FOR MONITORING THE OPERATION OF INDIVIDUAL CONNECTORS IN A MULTIPATH COUPLING NETWORK

FIELD OF THE INVENTION

My present invention relates to a method of and a system for monitoring the operation of a multipath coupling network designed to facilitate communication between signal-emitting and signal-receiving stations on opposite sides of that network.

BACKGROUND OF THE INVENTION

Such coupling networks are used, for example, in apparatus for checking the performance of several transmission lines with the aid of a processor to which pilot signals from these lines are successively fed. The coupling network is provided in that case with a plurality of inputs and a single output, the latter being tied to a common section of the several signal paths originating at the respective inputs. Conversely, a pilot signal may be fed in at a single input tied to a common section of several signal paths with terminate at respective outputs leading to lines that are to be successively tested.

For the selective transmission of pilot signals from or to any one of a plurality of stations located in a group on one side of the coupling network, the netowrk generally includes a plurality of connectors respectively linked with these stations. Activation of a selected connector, usually accompanied by other switching operations in other parts of the coupling network, establishes the desired signal path between the selected station of the group and the remote station. The other connectors, which are in an inactive state, cut off their respective stations to prevent signal leakages which could occur inside the network especially when the pilot signals are of high frequency. Thus, for example, where the lines to be tested serve for the transmission of telephone messages via high-frequency carriers, such leakages may result in undesirable cross-talk. In other instances, leakage may lead to contamination of the pilot signal being processed and may thus give rise to an incorrect evaluation.

To insure an effective cutoff it is known to provide each connector with a set of switches of the mechanical or the electronic type which are alternately in shunt and in series with the signal path, the shunt switches being closed and the series switches being open in the inactive state of the connector whereas the reverse relationship exists in its active state. A malfunction of any such switch, such as a "sticking" of a mechanical contact in an open or closed position, may seriously impair the decoupling effect of an inactive connector. Such malfunctions are liable to occur especially with automatic testing equipment in which these switches are subject to frequent reversals.

OBJECTS OF THE INVENTION

An object of my present invention, therefore, is to provide a method of monitoring the operation of the connectors of such a coupling network in order to detect possible malfunctions.

A related object is to provide a simple and efficient system for this purpose.

SUMMARY OF THE INVENTION

In accordance with my present invention, a switchover from one signal path to another is accompanied by the feeding of a test signal independent of the respective pilot signal via a conductor of the coupling network to one of the two connectors involved, i.e. to the hitherto active connector about to be deactivated or to the heretofore inactive connector chosen for activation. Next, the shunt and series switches of the connector supplied with the test signal are successively reversed in a sequence which causes the impedance of that connector to alternate between low and high levels until the opposite state has been reached by a reversal of all its switches. The responses of the test signal to the low and high impedance levels are compared with predetermined values and, in the case of a significant deviation therefrom, give rise to a malfunction indication which may be used to prevent completion of the switchover or to inhibit the processing of signals passing over the newly established path until the defect has been corrected.

Both direct and alternating currents may serve as the test signal. I prefer, however, to use direct current when the pilot signals transmitted through the coupling network are alternating voltages such as the carrier oscillations of telephone channels.

When the connector supplied with the test signal is the one which has been active just prior to the switchover, a control unit forming part of a monitoring system according to my invention advantageously includes a buffer register designed to store a switching code identifying the connector to be activated. With the aid of blocking means included in the control unit, a charge in the contents of the buffer register is prevented until all the shunt and series switches of the previously active connector identified by these contents have been successively reversed. The blocking means may comprise a timer emitting a series of stepping pulses to a pulse counter which commands the successive reversal of the several shunt and series switches in response to these stepping pulses.

When the coupling network is inserted between a group of first stations, respectively linked to its connectors, and a second station tied to the aforementioned common section of all the signal paths establishable by these connectors, the control unit may include a changeover switch for temporarily connecting the common path section to the source of test signals while disconnecting the second station therefrom. In this way, the test signal must pass through the very same path as the pilot signals traversing the monitored connector in its active state.

BRIEF DESCRIPTION OF THE DRAWING

The above and other features of my present invention will now be described in detail with reference to the accompanying drawing in which.

SPECIFIC DESCRIPTION

Figure 1:
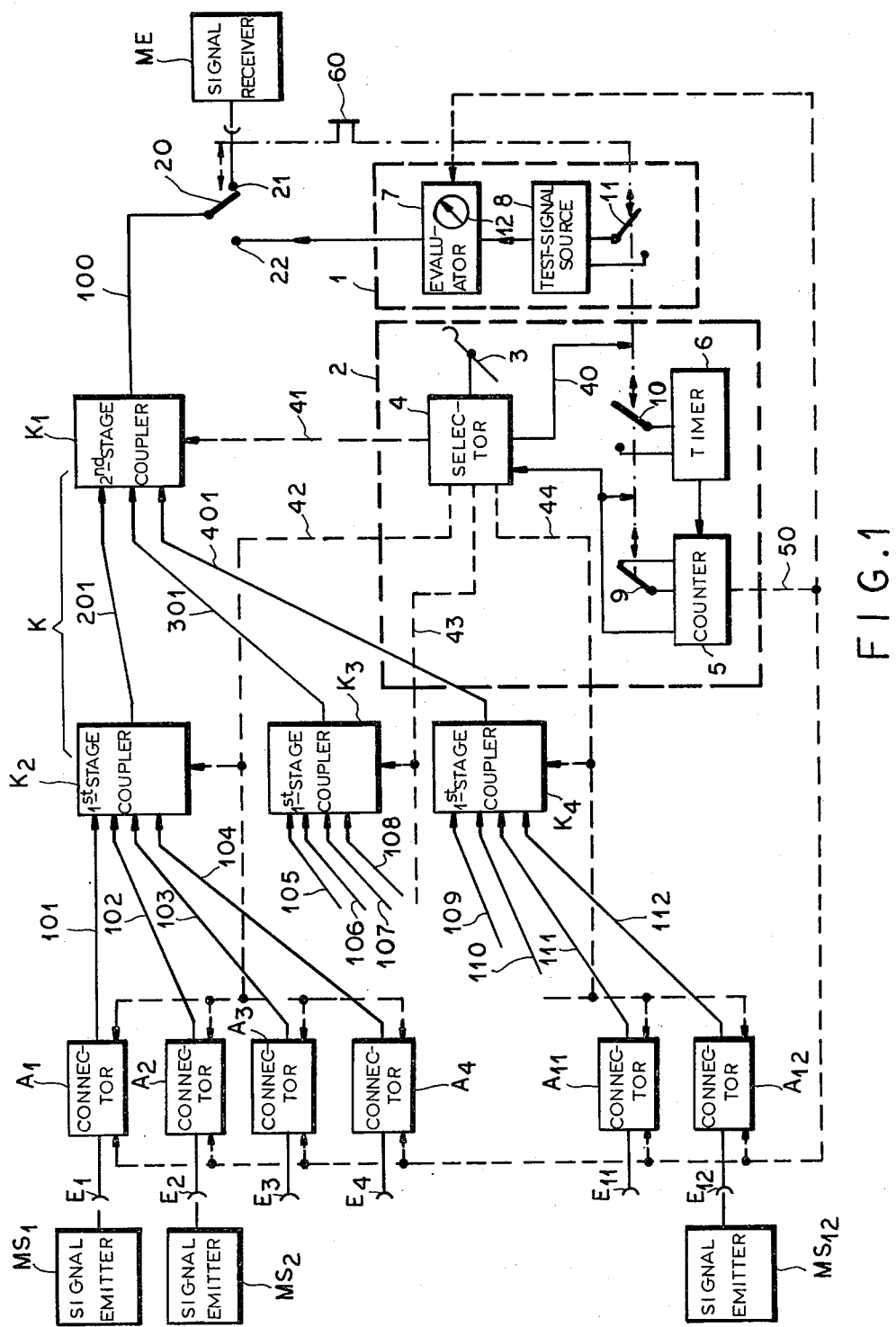
FIG. 1 is a block diagram showing the layout of a monitoring system according to my invention.

In FIG. 1 I have illustrated a group of signal-emitting stations $MS_1$, $MS_2$, ... $MS_{12}$ (shown only in part) working into inputs $E_1-E_{12}$ of respective connectors $A_1-A_{12}$. These connectors may be considered part of a coupling network K which comprises three first-stage couplers $K_2$, $K_3$, $K_4$ and one second-stage coupler $K_1$. The group of twelve connectors is divided into three subgroups of four connectors each, connectors $A_1$–$A_4$ of the first subgroup being joined by leads 101–104 to coupler $K_2$ while those of the second subgroup have leads 105–108 extending to coupler $K_3$ and those of the third subgroup (including the illustrated connectors $A_{11}$ and $A_{12}$) are provided with leads 109–112 terminating at coupler $K_4$. Further leads 201, 301 and 401 extend from these first-stage couplers to the second-stage coupler $K_1$ whose output is a lead 100 constituting a common section of the twelve signal paths originating at connectors $A_1$–$A_{12}$. Lead 100 terminates at a changeover switch 20 normally engaging an input terminal 21 of a signal-receiving station ME designed to feed pilot signals from any one station $MS_1$–$MS_{12}$ to a nonillustrated processor.

Also shown in FIG. 1 are a monitoring device 1 and a control unit 2. Device 1 includes a test-signal source 8, here assumed to be a direct-current generator, working via an evaluator 7 into a terminal 22 which is engageable by changeover switch 20 in its alternate position. Control unit 2 encompasses a selector 4 with a manual actuator 3, a pulse counter 5 and a timer 6. Counter 5 is normally short-circuited and timer 6 as well as source 8 are normally disabled by respective switches 9, 10 and 11 ganged with changeover switch 20.

Selector 4 is provided with several conductor multiples 41, 42, 43 and 44 respectively extending to couplers $K_1$, $K_2$, $K_3$ and $K_4$. Branches of the three last-mentioned multiples lead to the three subgroups of connectors $A_1$–$A_{12}$ respectively linked with couplers $K_2$–$K_4$. A further output lead 40 of selector 4, briefly energized in response to manipulation of actuator 3, temporarily reverses the ganged switches 9, 10, 11 and 20 at the beginning of a switchover. These switches can also be manually positioned with the aid of a knob 60. The reversal of the ganged switches initiated by a signal on lead 40 is maintained by the counter 5, via a lead 54 (FIG. 2) also extending to selector 4, until that counter has reset itself upon reaching its full count after being started by the opening of switch 9. Counter 5 has an output multiple 50 also extending to connectors $A_1$–$A_{12}$ as well as to evaluator 7; a meter 12 in this evaluator furnishes a malfunction indication upon detection of an improperly functioning connector as more fully described hereinafter.

Figure 2:
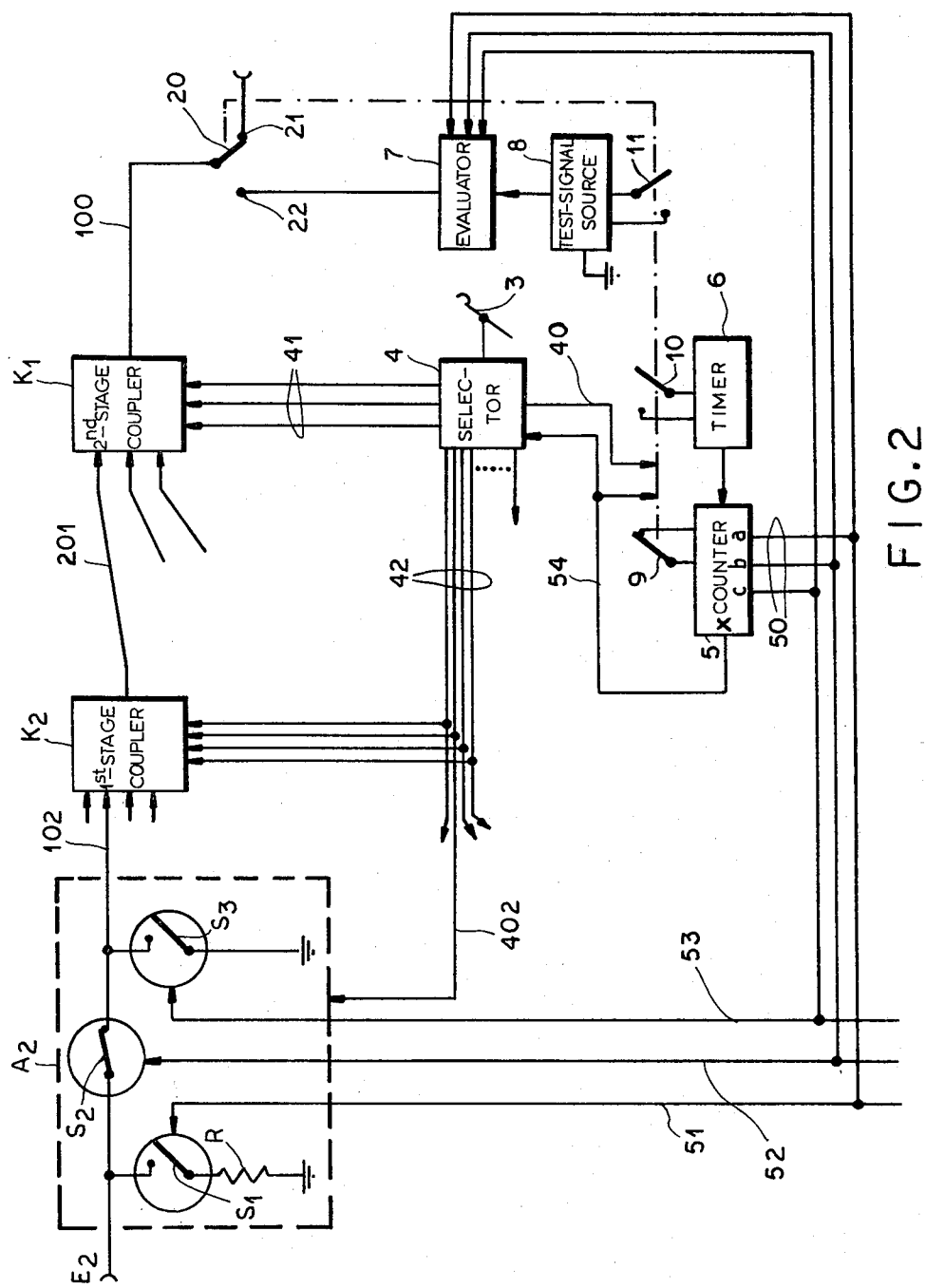
FIG. 2 is a more detailed diagram of some of the components shown in FIG. 1.

One such connector, specifically element $A_2$, has been illustrated in detail in FIG. 2 and is representative of the construction of all its mates. The connector comprises a series switch $S_2$ flanked by two shunt switches $S_1$ and $S_3$, switch $S_3$ being grounded whereas switch $S_1$ is connected to ground through a series impedance R (here shown as a resistor) which substantially matches the impedance of receiving station ME as seen from the emitting stations $MS_1$–$MS_{12}$ of FIG. 1. Connector $A_2$ has been shown in its active state, in which its outlying terminal $E_2$ is conductively coupled to network K, with shunt switches $S_1$ and $S_3$ open and with series switch $S_2$ closed. These three switches are controlled, in parallel with corresponding switches of all the other connectors, by respective leads 51, 52 and 53 forming part of the multiple 50 which emanates from pulse counter 5. A lead 402, included in the multiple 42 which originates at selector 4, serves for the activation of connector $A_2$ by placing its switches in the illustrated position. This activating command, however, can be overridden by deactivating commands appearing on leads 51, 52 and 53.

With lead 402 de-energized, switches $S_1$, $S_3$ are closed while switch $S_2$ is open.

Multiple 41 is shown in FIG. 2 to encompass three leads for the control of as many circuit closers in coupler $K_1$ serving to connect any of its input leads 201, 301, 401, FIG. 1, to its output lead 100. Analogously, the four leads of multiple 42 (and corresponding leads of multiples 43, 44) establish connections within the associated coupler $K_2$ (or $K_3$, $K_4$) between its output lead 201 (or 301, 401) and whichever one of its four input leads originates at a concurrently activated connector.

As more particularly illustrated in FIG. 2, leads 51, 52 and 53 are joined to three stage outputs a, b and c of counter 5. Another output x of the counter is tied to lead 54 and is energized as long as the counter is off-normal.

Figure 3:
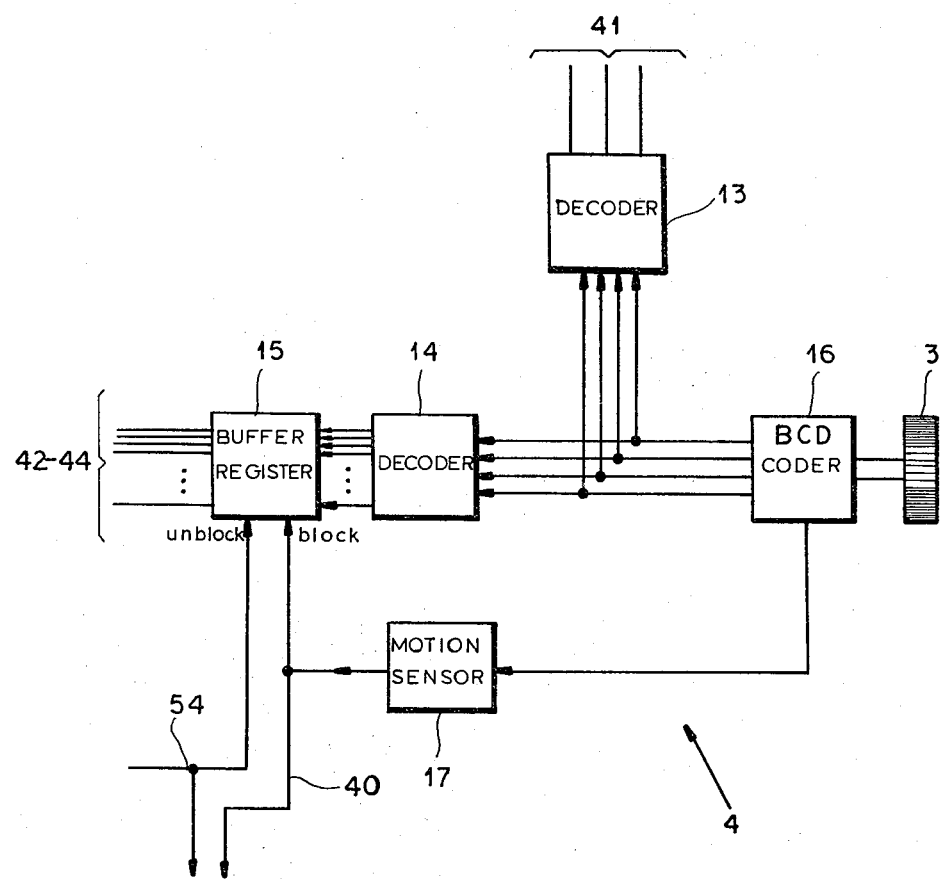
FIG. 3 shows details of a selector included in the system of FIGS. 1 and 2.

FIG. 3 shows the selector 4 as comprising a BCD coder 16 settable by the actuator 3, here shown as a rotatable knob, to emit switching information in the form of binary-coded decimal numbers to a pair of decoders 13 and 14. Decoder 13 energizes the output multiple 41 to set the coupler $K_1$ whereas decoder 14 identifies the connector to be activated as well as the setting of the associated coupler $K_2$, $K_3$ or $K_4$ required to establish a signal path from that connector to lead 100. Decoder 14 works into a buffer register 15 which, at the time of switchover, still holds the identity of the heretofore activated connector, specifically connector $A_2$. The turning of knob 3 is detected by a motion sensor 17 which thereupon energizes the lead 40; aside from controlling the reversal of switches 9, 10, 11 and 20 as described above, sensor 17 then also blocks the register 15 whose contents therefore remain unchanged. With signal source 8, timer 6 and counter 5 all operative, the counter energizes its off-normal output x connected to lead 54 which maintains the blocked state of register 15 as well as the alternate position of the disabling and changeover switches 9, 10, 11 and 20 even after the signal emitted by motion sensor 17 has decayed. If the emitting station identified by the new position of actuator 3 lies in the same subgroup as station MS2 associated with connector $A_2$, as where this is station $MS_1$ linked to connector $A_1$, the setting of coupler $K_1$ has not been changed by decoder 13 so that direct current from source 8 now passes via evaluator 7, lead 100, coupler $K_1$, lead 201, coupler $K_2$ and lead 102 to connector $A_2$.

Evaluator 7, located upstream of the signal path 100, 201, 102 leading to connector $A_2$, measures a voltage drop across a resistor traversed by the direct current; this voltage drop may be initially zero since the link between connector $A_2$ and the associated station includes a capacitor or a transformer passing only alternating current. I prefer, however, to let the counter 5 energize its stage output a immediately upon reversal of the preferably electronic switches 9, 10, 11 and 20 so that shunt switch $S_1$ of connector $A_2$ is closed substantially simultaneously with the changeover from terminal 21 to terminal 22. This avoids the appearance of annoying clicks in the line terminating at station MS2 since the output impedance of the coupling network K as seen by that line remains more or less unchanged. In such a case, therefore, the voltage drop registered by evaluator 7 has a finite magnitude determined by resistor R.

If this voltage drop agrees with a predetermined value, as established by a multilevel comparator in evaluator 7, indicator 12 does not register a malfunction while timer 6 steps the counter 5 which thereupon additionally energizes its stage output b tied to lead 52. The connection between multiple 50 and evaluator 7 also causes its comparator to switch to a new reference value, namely zero, as the opening of series switch $S_2$ produces a substantially infinite direct-current impedance for connector $A_2$ as seen from the test-signal path 100, 201, 102. With the next stepping pulse emitted by timer 6, counter 5 further energizes its stage output c tied to lead 53 whereby switch $S_3$ is closed to ground the signal path and establish a zero d-c impedance for that connector $A_2$, resulting in a voltage drop different from the one measured upon closure of switch $S_1$. If there is also no malfunction indication during these last two steps, the subsequent return of counter 5 to normal de-energizes the lead 54 and restores the switches 9, 10, 11 and 20 to normal even as register 15 of FIG. 3 in unblocked to reset the coupler $K_2$ with concurrent activation of connector $A_1$. If, however, a malfunction has been detected, the operator may prevent a return to normal with the aid of knob 60.

It should be noted that, in the system here described, the suppression of cross-talk by the prevention of leakage at the connector switches is critical only when the switchover occurs between connectors of the same subgroup served by one of the first-stage couplers $K_2$, $K_3$ or $K_4$, i.e. when the setting of the second-stage coupler $K_1$ is not changed. Otherwise, e.g. upon a switchover from station $MS_2$ to station $MS_{12}$, the successively established signal paths traverse different first-stage couplers aside from being also separated inside coupler $K_1$. In order to avoid spurious malfunction indications when switching from one subgroup to another, the coder 16 may be designed to trigger the motion sensor 17 only with switchovers occurring within a subgroup. Thus, for example, knob 3 could have three different axial positions assigned to respective subgroups, an axial shift remaining undetected by the sensor 17. Alternatively, of course, decoder 13 could be connected to the output of register 15 rather than to that of coder 16 so as to delay the resetting, if any, of coupler $K_1$. If closure of the grounded connector switch $S_3$ does not sufficiently attenuate a high-frequency pilot signal capacitively transmitted by the open switch $S_2$, at least one other series switch followed by a further shunt switch may be included in each connector. In that case, of course, the number of stages of counter 5 would have to be correspondingly increased.

It will be understood that such connectors could also be used elsewhere in network K, e.g. as part of the coupler $K_1$, to be monitored in the manner described above.

With only minor modifications of control unit 2, its mode of operation could be altered to let the counter 5 successively reverse the switches $S_3$, $S_2$, $S_1$ of a connector to be activated, without delay in the deactivation of the previously activated connector. In such a case, again, the operator may manually prevent a return of ganged switches 9, 10, 11 and 20 to their illustrated normal position upon detection of a malfunction indication. It will also be apparent that the restoration of these switches could be inhibited automatically in response to a command from malfunction indicator 12.

The monitoring system of FIG. 1 will function in essentially the way described above if the transmission of pilot signals takes place in the opposite direction, i.e. from station ME to a selected station of the group $MS_1$–$MS_{12}$.

I claim:
1. In a signal-processing system, in combination:
a coupling network comprising a plurality of connectors which are selectively activable, one at a time, for establishing one of a plurality of signal paths through said network, each of said connectors including an alternation of shunt and series switches, each series switch being closed and each shunt switch being open in an active state to facilitate the transmission of a pilot signal therethrough in series with an outlying terminal of the respective connector, each series switch being open and each shunt switch being closed in an inactive state to decouple said outlying terminal of the connector from the remainder of said network;
selector means operable to emit commands deactivating an active connector and activating an inactive connector for a switchover from one signal path to another;
a source of test signals;
switching means responsive to operation of said selector means for connecting said source via a common section of the signal paths of said network to a hitherto active connector involved in said switchover before decoupling same from said common section and for overriding the commands of said selector means with successive reversal of all shunt and series switches of said hitherto active connector in a sequence causing the impedance thereof to alternate between low and high levels until the opposite state is reached, said hitherto active connector remaining coupled to said common section throughout said sequence; and
evaluating means between said source and said common section for comparing the responses of said test signal to said low and high levels with predetermined values and generating a malfunction indication upon detection of a significant deviation from said predetermined values.
2. The combination defined in claim 1 wherein said source comprises a supply of direct current.
3. The combination defined in claim 1 or 2 wherein said selector means comprises a generator of switching codes, said control means including a buffer register connected to said generator for receiving therefrom a switching code identifying a connector to be activated and blocking means for preventing a change in the contents of said buffer register during successive reversal of all the shunt and series switches of a hitherto active connector identified by said contents.
4. The combination defined in claim 3 wherein said blocking means includes a timer emitting a series of stepping pulses and a pulse counter connected to said timer for commanding the reversal of said shunt and series switches in response to said stepping pulses.
5. In a signal-processing system, in combination:
a coupling network comprising a plurality of connectors which are selectively activable, one at a time, for establishing one of a plurality of signal paths through said network, each of said connectors including an alternation of shunt and series switches, said network being inserted between a group of first stations each linked to a respective connector and a second station joined to a common section of all said signal paths, each series switch being closed and each shunt switch being open in an active state to facilitate the transmission of a pilot signal therethrough in series with an outlying terminal of the respective connector, each series switch being open and each shunt switch being closed in an inactive state to decouple said outlying terminal of the connector from the remainder of said network;

selector means operable to emit commands deactivating an active connector and activating an inactive connector for a switchover from one signal path to another;

a source of test signals;

switching means responsive to operation of said selector means for connecting said source via a signal path of said network to one of the two connectors involved in said switchover before changing the existing state thereof and for overriding the commands of said selector means with successive reversal of all shunt and series switches of said one of the connectors in a sequence causing the impedance thereof to alternate between low and high levels until the opposite state is reached, said switching means including a changeover switch for temporarily connecting said common section to said source with disconnection of said second station; and evaluating means between said source and said connectors for comparing the responses of said test signal to said low and high levels with predetermined values and generating a malfunction indication upon detection of a significant deviation from said predetermined values.

6. The combination defined in claim 5 wherein said source comprises a supply of direct current.

7. The combination defined in claims 5 or 6 wherein said first stations are emitters of respective pilot signals, a first shunt switch of said alternation of shunt and series switches of each connector lying in series with an impedance element substantially matching the impedance of said second station as seen from said first stations, said first shunt switch of any active connector being closable by said control unit concurrently with a reversal of said changeover switch to connect said source to said common section.

* * * * *